US008823052B2

(12) United States Patent
Rahimo

(10) Patent No.: US 8,823,052 B2
(45) Date of Patent: Sep. 2, 2014

(54) POWER SEMICONDUCTOR DEVICE

(75) Inventor: Munaf Rahimo, Uezwil (CH)

(73) Assignee: ABB Technology AG, Zurich (CH)

(*) Notice: Subject to any disclaimer, the term of this patent is extended or adjusted under 35 U.S.C. 154(b) by 0 days.

(21) Appl. No.: 13/530,727

(22) Filed: Jun. 22, 2012

(65) Prior Publication Data

US 2012/0299054 A1 Nov. 29, 2012

Related U.S. Application Data

(63) Continuation of application No. PCT/EP2010/069590, filed on Dec. 14, 2010.

(30) Foreign Application Priority Data

Dec. 22, 2009 (EP) .................................... 09180284

(51) Int. Cl.
*H01L 29/739* (2006.01)
*H01L 29/10* (2006.01)
*H01L 29/08* (2006.01)
*H01L 29/74* (2006.01)
*H01L 29/744* (2006.01)

(52) U.S. Cl.
CPC ............. *H01L 29/74* (2013.01); *H01L 29/102* (2013.01); *H01L 29/0839* (2013.01); *H01L 29/744* (2013.01)
USPC ............. 257/139; 257/E29.037; 257/E29.038

(58) Field of Classification Search
USPC ............................................... 257/107–182
See application file for complete search history.

(56) References Cited

U.S. PATENT DOCUMENTS 4,825,270 A 4/1989 Satou et al.
4,843,449 A 6/1989 Jaecklin et al.
(Continued)

FOREIGN PATENT DOCUMENTS

EP 0 144 141 A1 6/1985
EP 0 190 934 A2 8/1986
(Continued)

OTHER PUBLICATIONS

International Preliminary Report on Patentability (PCT/IB/373) issued on Jun. 26, 2012, by the European Patent Office as the International Searching Authority for International Application No. PCT/EP2010/069590.

(Continued)

*Primary Examiner* — Fernando L Toledo
*Assistant Examiner* — Lawrence-Linh T Nguyen
(74) *Attorney, Agent, or Firm* — Buchanan Ingersoll & Rooney PC

(57) ABSTRACT

A power semiconductor device includes a four-layer structure having layers arranged in order: (i) a cathode layer of a first conductivity type with a central area being surrounded by a lateral edge, the cathode layer being in direct electrical contact with a cathode electrode, (ii) a base layer of a second conductivity type, (iii) a drift layer of the first conductivity typehaving a lower doping concentration than the cathode layer, and (iv) an anode layer of the second conductivity type which is in electrical contact with an anode electrode. The base layer includes a first layer as a continuous layer contacting the central area of the cathode layer. A resistance reduction layer, in which the resistance at the junction between the lateral edge of the cathode and base layers is reduced, is arranged between the first layer and the cathode layer and covers the lateral edge of the cathode layer.

20 Claims, 5 Drawing Sheets

(56) References Cited

U.S. PATENT DOCUMENTS

| | | | |
|---|---|---|---|
| 4,951,109 A | | 8/1990 | Bechteler et al. |
| 5,387,806 A | | 2/1995 | Franz |
| 5,412,228 A | * | 5/1995 | Baliga .......................... 257/133 |
| 2007/0120145 A1 | * | 5/2007 | Asano et al. .................. 257/115 |

FOREIGN PATENT DOCUMENTS

| | | |
|---|---|---|
| EP | 0 231 895 A2 | 8/1987 |
| JP | 57-201078 A | 12/1982 |

OTHER PUBLICATIONS

International Search Report (PCT/ISA/210) issued on Feb. 16, 2011, by the European Patent Office as the International Searching Authority for International Application No. PCT/EP2010/069590.

Search Report issued on Jun. 29, 2010, by the European Patent Office for Application No. 09180284.3.

Baliga, "Power Semiconductor Devices", Dec. 31, 1995, PWS publishing company, XP002586627, pp. 302-305.

* cited by examiner

US 8,823,052 B2

POWER SEMICONDUCTOR DEVICE

RELATED APPLICATIONS

This application claims priority as a continuation application under 35 U.S.C. §120 to PCT/EP2010/069590, which was filed as an International Application on Dec. 14, 2010 designating the U.S., and which claims priority to European Application 09180284.3 filed in Europe on Dec. 22, 2009. The entire contents of these applications are hereby incorporated by reference in their entireties.

FIELD

The present disclosure relates to the field of power semiconductor devices. More particularly, the present disclosure relates to a four-layer power integrated gate commutated thyristor.

BACKGROUND INFORMATION

A known integrated gate commutated thyristor (IGCT) structure is shown in FIG. 1. The IGCT (which may hereinafter be referred to as a "device") 100 includes a cathode side 11 and an anode side 12, which is arranged opposite to the cathode side 11. It is constructed as a four-layer p-n-p-n structure with layers of different conductivity types. The four-layer structure defines an inner structure of a thyristor, which can be turned-off via a gate electrode 4. The layers are arranged between a cathode electrode 2 on the cathode side 11 and an anode electrode 3 on the anode side 12 in the following order: (i) an n doped cathode layer 5 with a central area, which is surrounded by a lateral edge, which cathode layer 5 is in direct electrical contact with the cathode electrode 2; (ii) a p doped base layer 6; (iii) an (n−) doped drift layer 7, wherein the drift layer 7 has a lower doping concentration than the cathode layer 5; (iv) an n doped buffer layer 9, which has a higher doping concentration than the drift layer 7; and (v) a p doped anode layer 8, which is in electrical contact with the anode electrode 3.

The gate electrode 4 is arranged on the cathode side 11 lateral to the cathode electrode 2, and the gate electrode 4 is in electrical contact with the base layer 6, but electrically separated from the cathode electrode 2. The p doped base layer 6 includes a first layer 61 as a continuous layer over the whole plane of the device and a second layer 63, which is arranged between the first layer 61 and the drift layer 7. The second layer 63 is also a continuous layer over the whole plane of the device, and the second layer 63 has a lower doping concentration than the first layer 61.

During turn-off, the device gate voltage is negatively biased and most holes are attracted towards the gate electrode 4. During high stress such as high voltage and high current turn-off switching, the device enters dynamic avalanche whereas the peak electric field is distributed uniformly in the active region along the whole main blocking junction between the cathode layer 5 and the base layer 6. The avalanche-generated holes follow the path towards the gate terminal including the regions directly positioned below the (n++) cathode layer 5 as shown in FIG. 2. The width of the cathode layer 5 is generally above 100 μm depending on the design. Therefore, many holes flow a substantial distance directly in the (p+) doped first layer 61 along the junction between the (n++) cathode layer 5 and the (p+) first layer 61. In the region where strong curvature occurs in the n++/p+ junction, a high concentration of holes could result in relatching of the device and hence, failure.

Different documents deal with another semiconductor type, GTOs, which have highly p doped layers, but for different purposes.

U.S. Pat. No. 4,843,449 discloses a GTO which includes a p doped base layer and above it, an (n+)-doped emitter layer. The (n+) emitter layer is created by either local diffusion of n-particles or by initially creating a homogeneous (n+)-layer, which is then selectively etched away. In order to from a different layer resistance a more strongly doped p layer can be made after the etching in the areas, in which the p-base layer emerges on the surface. The (p+) doped layer touches, but does not cover the edge of the emitter layer.

U.S. Pat. No. 5,387,806 discloses a GTO with a p-base layer and a more highly doped (p+) layer. The (p+) layer is arranged between gate electrode and p base layer, and is terminated laterally to the gate electrode such that the base layer is arranged between and thereby separates the (p+) layer from the cathode layer. There is no (p+) layer arranged between cathode layer and the p base layer, and the (p+) layer does not cover the lateral edge of the cathode layer.

JP 57 201078 discloses a GTO with a p+ layer between gate electrode and p base layer. The p+ layer is not in contact with the (n+) emitter layer.

SUMMARY

An exemplary embodiment of the present disclosure provides an integrated gate commutated thyristor (ICGT) device. The exemplary device includes a cathode side, an anode side which is arranged opposite to the cathode side, a gate electrode, a cathode electrode on the cathode side, and an anode electrode on the anode side. The exemplary device also includes a four-layer structure with layers of different conductivity types. The four-layer structure defines an inner structure of a thyristor, which is configured to be turned-off via the gate electrode. The layers of the four-layer structure include the following layers arranged between the cathode electrode on the cathode side and the anode electrode on the anode side in the following order: (i) a cathode layer of a first conductivity type with a central area, which is surrounded by a lateral edge, the cathode layer being in direct electrical contact with the cathode electrode; (ii) a base layer of a second conductivity type; (iii) a drift layer of the first conductivity type, the drift layer having a lower doping concentration than the cathode layer; and (iv) an anode layer of the second conductivity type, the anode layer being in electrical contact with the anode electrode. The gate electrode is arranged on the cathode side lateral to the cathode electrode, and the gate electrode is in electrical contact with the base layer. The base layer includes at least one first layer with a first maximum doping concentration in a first depth as a continuous layer. The at least one first layer contacts the central area of the cathode layer. The exemplary device also includes a resistance reduction layer, in which the resistance at a junction between the lateral edge of the cathode layer and the base layer is reduced. The resistance reduction layer is of the second conductivity type, has a higher doping concentration than the first layer, is arranged between the first layer and the cathode layer, and covers the lateral edge of the cathode layer towards the first layer.

BRIEF DESCRIPTION OF THE DRAWINGS

Additional refinements, advantages and features of the present disclosure are described in more detail below with reference to exemplary embodiments illustrated in the drawings, in which.

The reference symbols used in the drawings and their meanings are summarized in the list of reference symbols. Generally, alike or alike-functioning parts are given the same reference symbols. The described embodiments are meant as examples and shall not confine the present disclosure.

DETAILED DESCRIPTION

Exemplary embodiments of the present disclosure provide a four-layer power semiconductor device in the form of an integrated gate commutated thyristor (IGCT) with high latch up current during turn-off for increased safe operating area performance.

An exemplary embodiment of the present disclosure provides an IGCT device which includes a cathode side and an anode side, which is arranged opposite to the cathode side. The device includes a four-layer structure with layers of different conductivity types. The four-layer structure defines an inner structure of a thyristor, which can be turned-off via a gate electrode. The layers are arranged between a cathode electrode on the cathode side and an anode electrode on the anode side in the following order: (i) a cathode layer of a first conductivity type with a central area, which is surrounded by a lateral edge, which cathode layer is in direct electrical contact with the cathode electrode; (ii) a base layer of a second conductivity type; (iii) a drift layer of the first conductivity type, wherein the drift layer has a lower doping concentration than the cathode layer; and (iv) an anode layer of the second conductivity type, which is in electrical contact with the anode electrode.

The gate electrode is arranged on the cathode side lateral to the cathode electrode, and the gate electrode is in electrical contact with the base layer. The base layer includes at least one first layer as a continuous layer.

A resistance reduction layer is arranged between the first layer and the cathode side and covers the lateral edge of the cathode layer on its side towards the base layer. The resistance at the junction between the lateral edge of the cathode layer and the base layer is reduced by the introduction of the resistance reduction layer. In accordance with an exemplary embodiment, the resistance reduction layer may completely cover the lateral edge of the cathode layer. The resistance reduction layer is of the second conductivity type and has a higher doping concentration than the first layer.

Thereby, a re-latching of the main pnpn thyristor structure is prevented during avalanche at turn-off.

Figure 1:
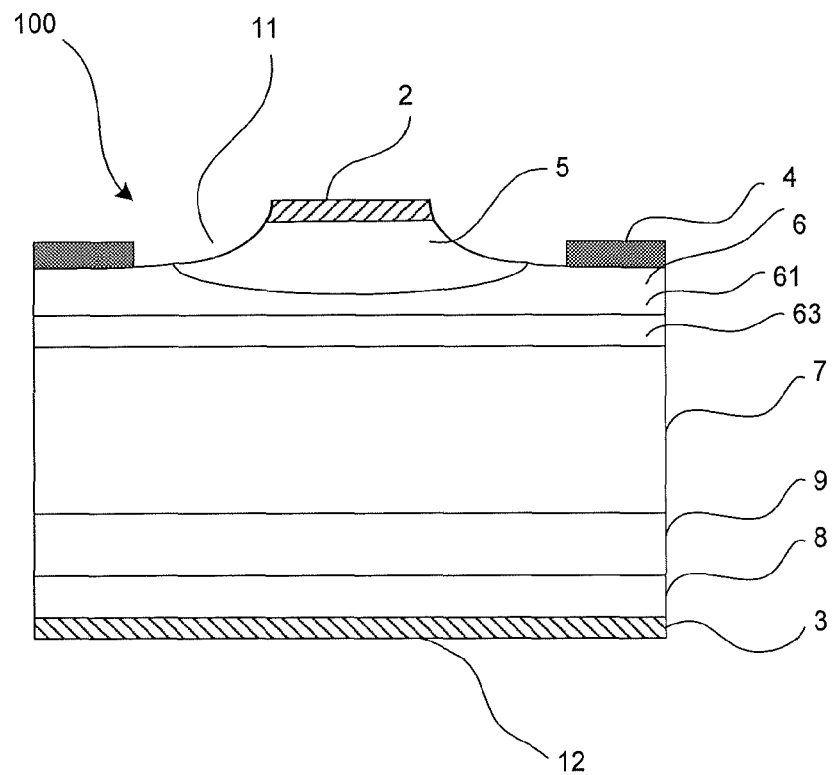
FIG. 1 shows a known integrated gate commutated thyristor (IGCT)
Figure 2:
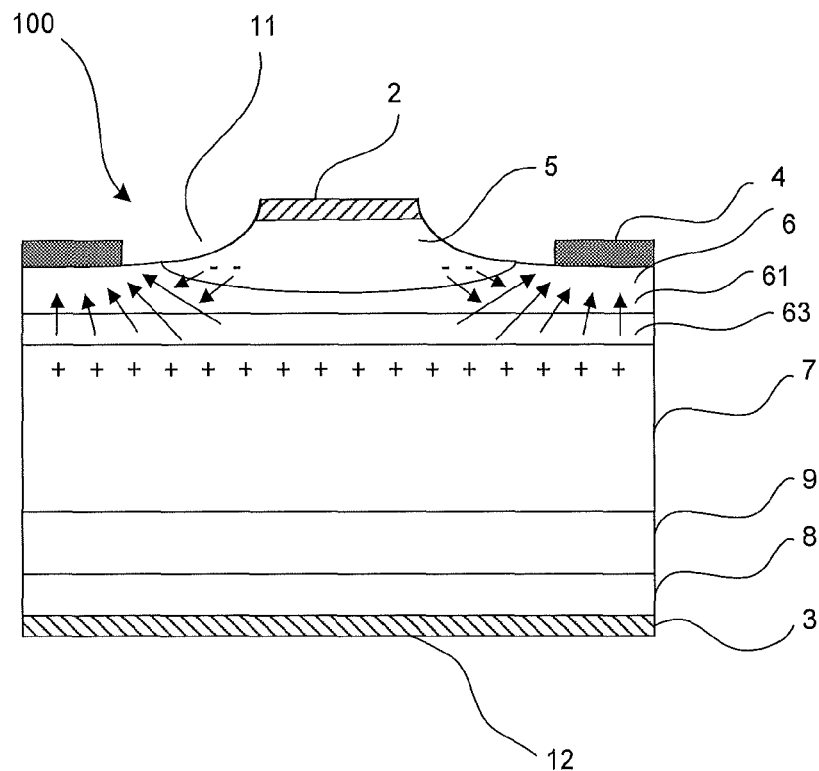
FIG. 2 shows the hole path during turn-off of the device for a known IGCT.
Figure 3:
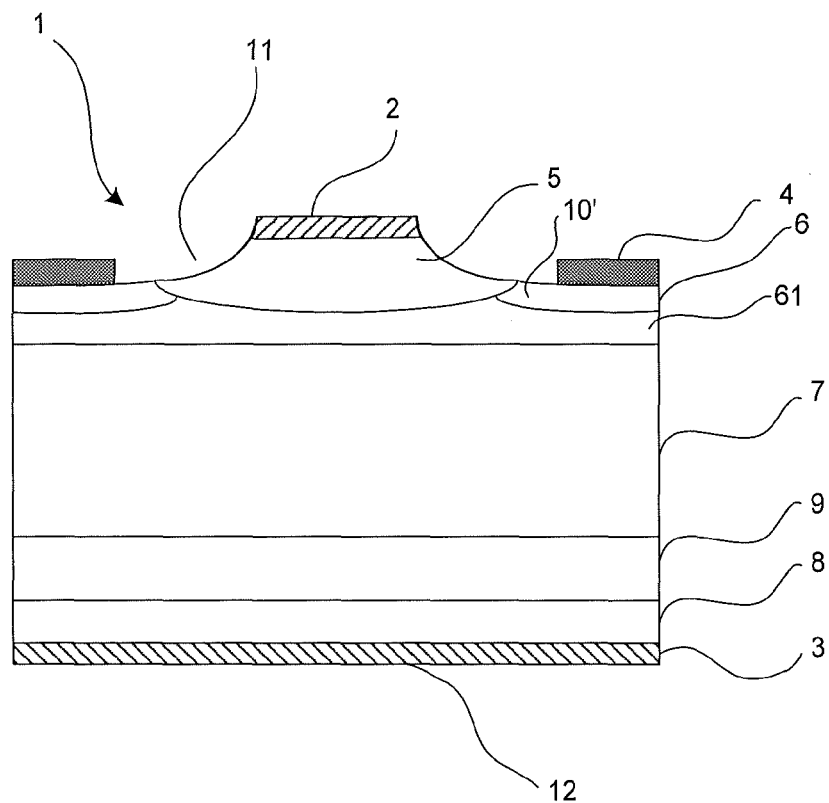
FIG. 3 shows an exemplary embodiment of an IGCT device according to the present disclosure.

Contrary to the situation as shown in FIG. 2, in accordance with the IGCT device of the present disclosure, the holes can be better collected in the second region and thereby, immunity is increased to latch up in the first region as shown in FIG. 3.

The resistance reduction layer will have no negative influence on the device conduction and turn-on performance since it is restricted to the lateral edge of the of the cathode layer.

Additional advantages according to the present disclosure will be explained below with reference to the exemplary embodiments illustrated in the drawings.

FIG. 3 shows an exemplary embodiment of a power semiconductor device 1 in the form of an integrated gate commutated thyristor (IGCT) (the IGCT may hereinafter be referred to as a "device") with a four-layer structure (p-n-p-n). The IGCT includes a cathode side 11 and an anode side 12, which is arranged opposite to the cathode side 11. The layers are arranged between a cathode electrode 2 on the cathode side 11 and an anode electrode 3 on the anode side 12 in the following order: (i) an (n+) doped cathode layer 5 with a central area, which is surrounded by a lateral edge, which cathode layer 5 is in direct electrical contact with the cathode electrode 2; (ii) a p doped base layer 6; (iii) an (n−) doped drift layer 7, which has a lower doping concentration than the cathode layer 5; and (iv) a p doped anode layer 8, which is in electrical contact with the anode electrode 3.

A gate electrode 4 is arranged on the cathode side 11 lateral to the cathode electrode 2, and the gate electrode 4 is in electrical contact with the base layer 6. The gate electrode 4 is separated from the cathode electrode 2. The base layer 6 includes at least one first layer 61, which is contacting the central area of the cathode layer 5. The first layer 61 has a first maximum doping concentration 615 in a first depth 610. The first layer 61 is formed as a continuous layer, for example, over the whole plane of the device. "Over the whole of the device" shall be understood to mean the layer is present at least over the active area of the device (the area between the base layer 6 and the anode layer 8). In accordance with an exemplary embodiment, the first layer 61 is formed as a diffused layer.

A resistance reduction layer 10, 10', 10" is arranged between the first layer 61 and the cathode layer 5 on the cathode side 11, and covers the lateral edge of the cathode layer 5. The resistance reduction layer 10' as shown in FIG. 3 is a p doped layer and has a higher doping concentration than the first layer 61. In this layer 10, 10', 10", the resistance of the junction between the edge of the cathode layer 5 and the base layer 6 is reduced.

The edge of the cathode layer 5 towards the base layer 6 is covered by the resistance layer 10'. By the resistance reduction layer 10' covering the lateral edge of the cathode layer 5, there is an overlap of these layers in a direction perpendicular to the cathode side 11 as well as in a direction parallel to the cathode side 11. The overlap is such that the cathode layer 5 is arranged at the surface of the IGCT and the lateral edge of the resistance layer is arranged closer towards the anode side 12 than the lateral edge of the cathode layer 5. Lateral means a direction perpendicular to the cathode side 11.

Figure 4:
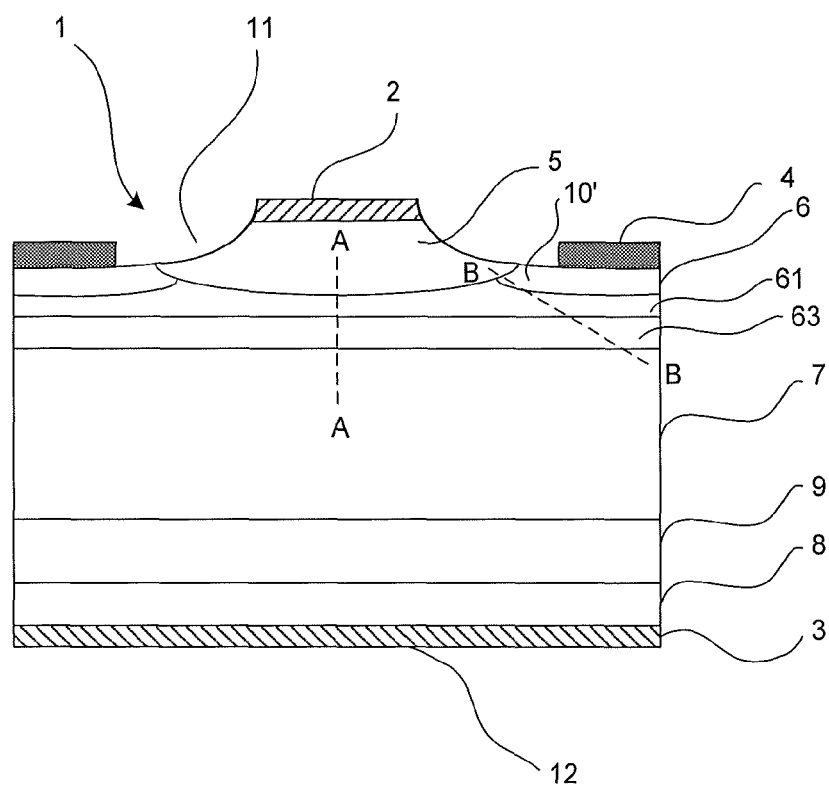
FIG. 4 shows an exemplary embodiment of an IGCT device according to the present disclosure.

As shown in the exemplary embodiment illustrated in FIG. 4, the IGCT of the present may also include a second layer 63, which is arranged between the first layer 61 and the drift layer 7. In accordance with an exemplary embodiment, the second layer 63 is a diffused layer. The second layer 63 has a second maximum doping concentration 635, which is lower than the first maximum doping concentration 615, in a second depth 630, which depth is greater than the first depth 610. Both depths 610, 630 are measured from the cathode side 11.

This second layer 63 is a continuous layer, for example, over the whole plane of the device, and has a lower doping concentration than the first layer 61, but higher than the drift layer 7.

Figure 5:
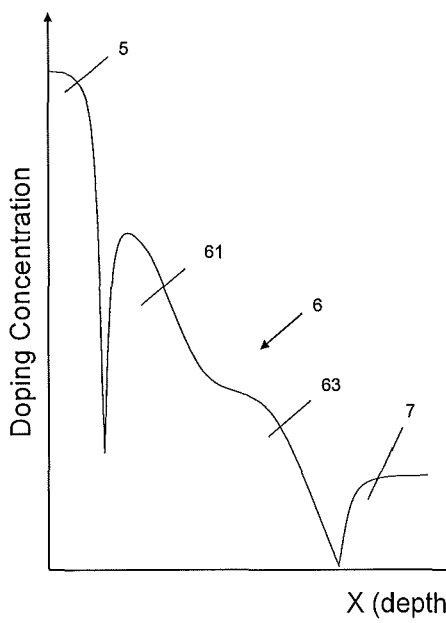
FIG. 5 shows the doping concentrations for the exemplary embodiment of an IGCT device according to the FIG. 4 along the cut A-A.
Figure 6:
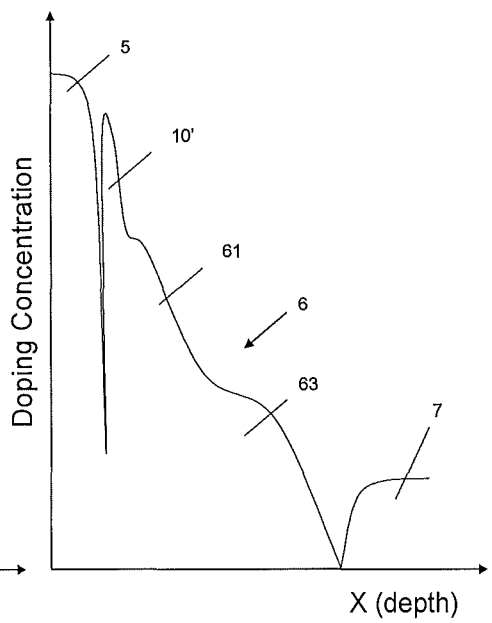
FIG. 6 shows the doping concentrations for the exemplary embodiment of an IGCT device according to the FIG. 4 along the cut B-B.

FIGS. 5 and 6 show cuts along the lines A-A and B-B of FIG. 4 for the doping concentrations. In accordance with an exemplary embodiment, the cathode layer 5 has a doping concentration higher than $1*10^{19}$ cm$^{-3}$. An exemplary value for the doping concentration of the first layer 61 is between $1*10^{16}$ cm$^{-3}$ and $5*10^{17}$ cm$^{-3}$. The second layer 63 has a lower doping concentration than the first layer 61 of less than $1*10^{16}$ cm$^{-3}$. The cut B-B also goes through the resistance reduction layer 10', which has a doping concentration between $5*10^{17}$ cm$^{-3}$ and $1*10^{19}$ cm$^{-3}$.

In any case, the choice of the doping concentration depends on the design of the device such as the thicknesses of the layers and the doping concentrations of the other p doped layers on the cathode side 11.

There may be a buffer layer 9 doped with the first conductivity type arranged between the drift layer 7 and the anode layer 8, wherein the doping concentration of the buffer layer 9 is higher than that of the drift layer 7. Such a buffer layer 9 is only optionally present and devices such as reverse blocking IGCTs, for example, do not have such a buffer layer.

Figure 7:
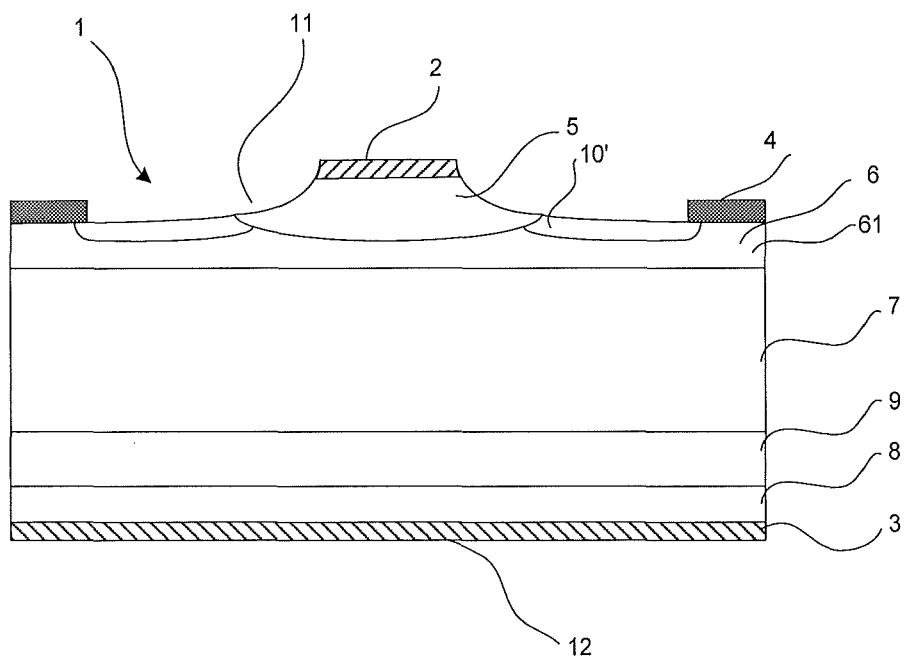
FIGS. 7 to 10 show additional exemplary embodiments of IGCT devices according to the present disclosure.

In FIGS. 3, 4 and 7, the resistance reduction layer 10' is in direct electrical contact with the gate electrode 4. Such an electrical contact can be achieved, for example, by completely covering the gate electrode 4 on its side towards the base layer 6 with the resistance reduction layer 10' so that the resistance reduction layer 10' separates the gate electrode 4 from the first layer 61 as shown in FIGS. 3 and 4. In the exemplary device as shown in FIG. 7, the resistance reduction layer 10' may be designed such that only the edge of the gate electrode 4 is in direct contact with the resistance reduction layer 10'.

Figure 8:
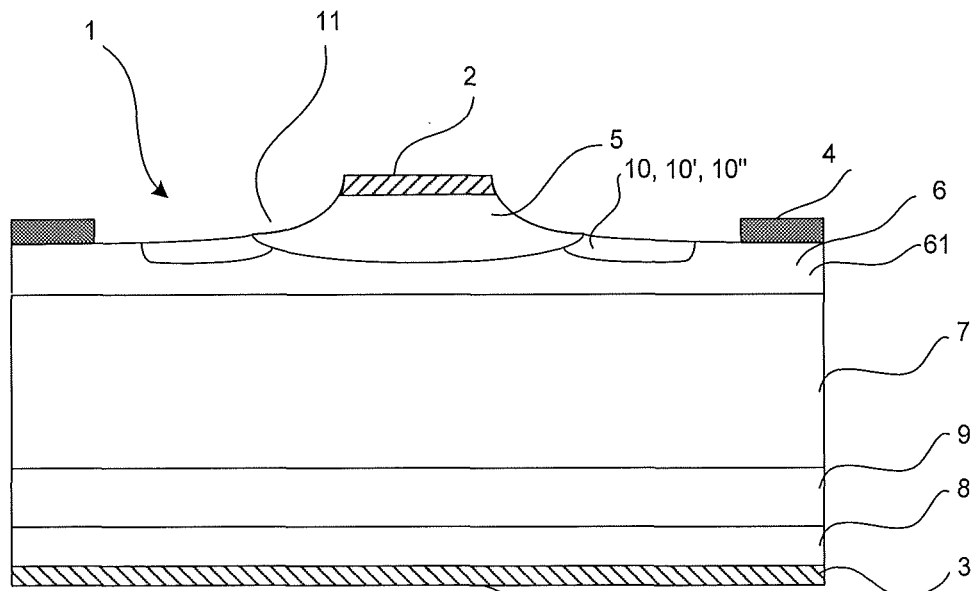

In accordance with an exemplary embodiment, the resistance reduction layer 10" may be separated from the gate electrode 4 by the first layer 61 so that there is no direct contact between the resistance reduction layer 10' and the gate electrode 4 (FIG. 8).

The devices of the present disclosure generally have a mesa structure, in which the cathode layer 5 is elevated to the plane, in which the base layer 6 is arranged by partial etching of the wafer on the cathode side 11, by which etching the cathode layer 5, which has been created before as a continuous layer, is restricted to projecting areas. The gate electrodes 4 are arranged in the areas which are etched away. This projection can be so large that the cathode layer 5 projects from the plane, in which the first layer 61 is arranged on that side, on which the cathode electrode 2 is arranged, or the resistance reduction layer 10' may even be arranged completely in another, higher lying plane.

Figure 9:
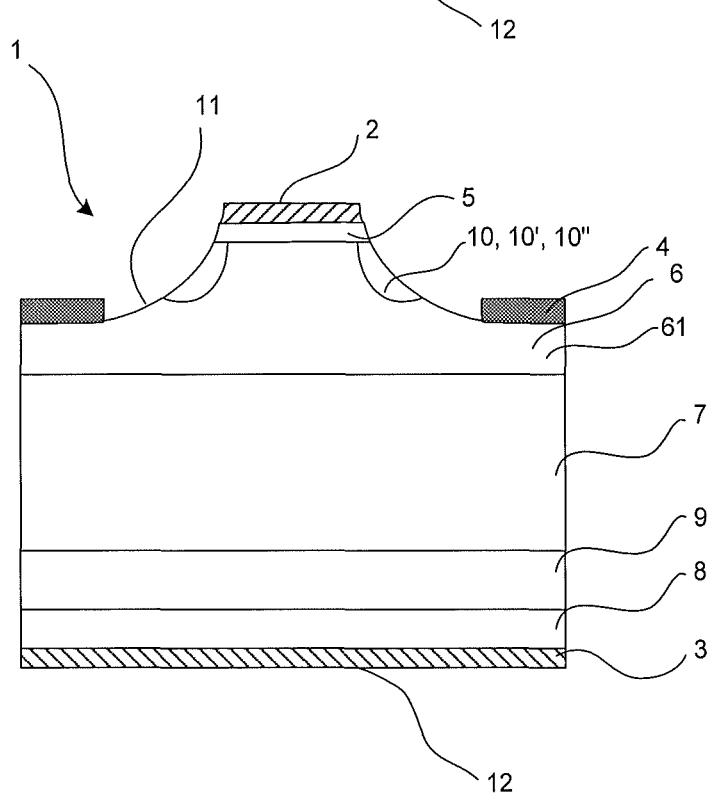
Figure 10:
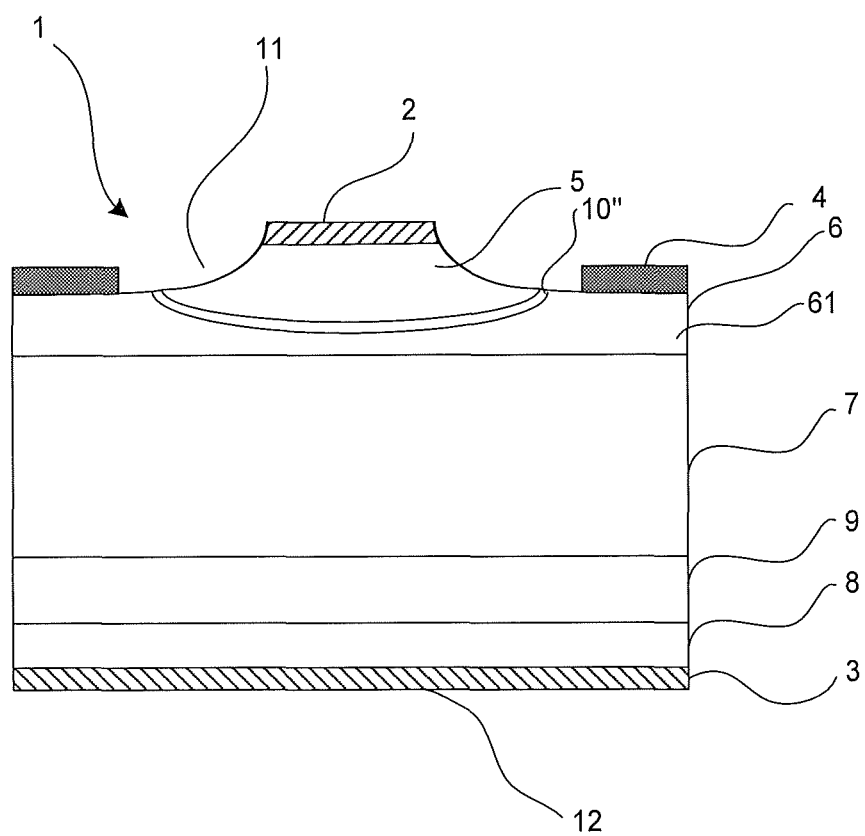

Alternatively to the above disclosed structure of a device with a resistance reduction layer of the second conductivity type, the lateral resistance at the lateral junction between the cathode layer 5 and the first layer 61 can also be reduced by introduction of a resistance reduction layer 10" of the first conductivity type, which separates the edge of the cathode layer 5 from the first layer 61. Such a resistance reduction layer 10" has a lower doping concentration than the cathode layer 5, but higher than the drift layer 7. Such an n doped resistance reduction layer 10" may be arranged in the same manner as the resistance reduction layer 10', for example, only at the edge of the cathode layer 5, as described above for FIGS. 8 and 9. Alternatively, the resistance reduction layer 10" may also be arranged such that it completely separates the cathode layer 5 from the first layer 61 as shown in FIG. 10.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

LIST OF REFERENCE SYMBOLS

1 Power semiconductor device
100 Known IGCT
10, 10', 10" Resistance reduction layer
11 Cathode side
12 Anode side
2 Cathode electrode
3 Anode electrode
4 Gate electrode
5 Cathode layer
6 Base layer
61 First layer
610 First layer depth
615 Maximum doping concentration of the first layer
63 Second layer
630 Second layer depth
635 Maximum doping concentration of the second layer
7 Drift layer
8 Anode layer
9 Buffer layer

What is claimed is:

1. An integrated gate commutated thyristor device, comprising:
   a cathode side;
   an anode side which is arranged opposite to the cathode side;
   a gate electrode;
   a cathode electrode on the cathode side;
   an anode electrode on the anode side; and
   a four-layer structure with layers of different conductivity types, the four-layer structure defining an inner structure of a thyristor, which is configured to be turned-off via the gate electrode,
   wherein the layers of the four-layer structure include the following layers arranged between the cathode electrode on the cathode side and the anode electrode on the anode side in the following order:
   a cathode layer of a first conductivity type with a central area, which is surrounded by a lateral edge, the cathode layer being in direct electrical contact with the cathode electrode;
   a base layer of a second conductivity type;
   a drift layer of the first conductivity type, the drift layer having a lower doping concentration than the cathode layer; and
   an anode layer of the second conductivity type, the anode layer being in electrical contact with the anode electrode,
   wherein the gate electrode is arranged on the cathode side lateral to the cathode electrode, and the gate electrode is in electrical contact with the base layer,
   wherein the base layer includes at least one first layer with a first maximum doping concentration in a first depth as a continuous layer, the at least one first layer contacting the central area of the cathode layer,
   wherein the device comprises a resistance reduction layer, in which the resistance at a junction between the lateral edge of the cathode layer and the base layer is reduced, and wherein the resistance reduction layer is of the second conductivity type, has a higher doping concentration than the first layer, is arranged between the first layer and the cathode layer, and covers the lateral edge of the cathode layer towards the first layer such that there is an overlap of the resistance reduction layer and the cathode layer in a direction perpendicular to the cathode side as well as in a direction parallel to the cathode side.

2. The integrated gate commutated thyristor device according to claim 1, wherein the base layer comprises a second layer as a continuous layer with a second maximum doping concentration in a second depth, wherein the second layer is arranged between the at least one first layer and the drift layer, the first maximum doping concentration is higher than the second maximum doping concentration, and the second depth is greater than the first depth.

3. The integrated gate commutated thyristor device according to claim 2, wherein the first and second layers are diffused layers.

4. The integrated gate commutated thyristor device according to claim 1, comprising:

a buffer layer of the first conductivity type, the buffer layer being arranged between the drift layer and the anode layer, and the buffer layer having a higher maximum doping concentration than the drift layer.

5. The integrated gate commutated thyristor device according to claim 1, wherein the resistance reduction layer is separated from the gate electrode by the at least one first layer.

6. The integrated gate commutated thyristor device according to claim 5, wherein the cathode layer one of (i) projects from a plane in which the at least one first layer is arranged, and (ii) is arranged above the plane in which the first layer is arranged, on a side, on which the cathode electrode is arranged.

7. The integrated gate commutated thyristor device according to claim 1, wherein the resistance reduction layer is in direct electrical contact with the gate electrode.

8. The integrated gate commutated thyristor device according to claim 6, wherein the resistance reduction layer is in direct contact only to an edge of the gate electrode.

9. The integrated gate commutated thyristor device according to claim 6, wherein the resistance reduction layer has a doping concentration in a range between $5*10^{17}$ cm$^{-3}$ and $1*10^{19}$ cm$^{-3}$, and the resistance reduction layer. separates the gate electrode from the first layer.

10. The integrated gate commutated thyristor device according to claim 2, comprising:

a buffer layer of the first conductivity type, the buffer layer being arranged between the drift layer and the anode layer, and the buffer layer having a higher maximum doping concentration than the drift layer.

11. The integrated gate commutated thyristor device according to claim 10, wherein the resistance reduction layer is separated from the gate electrode by the at least one first layer.

12. The integrated gate commutated thyristor device according to claim 11, wherein the cathode layer one of (i) projects from a plane in which the at least one first layer is arranged, and (ii) is arranged above the plane in which the first layer is arranged, on a side, on which the cathode electrode is arranged.

13. The integrated gate commutated thyristor device according to claim 12, wherein the resistance reduction layer is in direct contact only to an edge of the gate electrode.

14. The integrated gate commutated thyristor device according to claim 12, wherein the resistance reduction layer has a doping concentration in a range between $5*10^{17}$ cm$^{-3}$ and $1*10^{19}$ cm$^{-3}$, and the resistance reduction layer separates the gate electrode from the first layer.

15. The integrated gate commutated thyristor device according to claim 3, comprising:

a buffer layer of the first conductivity type, the buffer layer being arranged between the drift layer and the anode layer, and the buffer layer having a higher maximum doping concentration than the drift layer.

16. The integrated gate commutated thyristor device according to claim 15, wherein the resistance reduction layer is separated from the gate electrode by the at least one first layer.

17. The integrated gate commutated thyristor device according to claim 16, wherein the cathode layer one of (i) projects from a plane in which the at least one first layer is arranged, and (ii) is arranged above the plane in which the first layer is arranged, on a side, on which the cathode electrode is arranged.

18. The integrated gate commutated thyristor device according to claim 17, wherein the resistance reduction layer is in direct contact only to an edge of the gate electrode.

19. The integrated gate commutated thyristor device according to claim 17, wherein the resistance reduction layer has a doping concentration in a range between $5*10^{17}$ cm$^{-3}$ and $1*10^{19}$ cm$^{-3}$, and the resistance reduction layer separates the gate electrode from the first layer.

20. The integrated gate commutated thyristor device according to claim 4, wherein the resistance reduction layer is separated from the gate electrode by the at least one first layer.

* * * * *